United States Patent
Venkatraman

(10) Patent No.: US 6,987,040 B2
(45) Date of Patent: Jan. 17, 2006

(54) TRENCH MOSFET WITH INCREASED CHANNEL DENSITY

(75) Inventor: Prasad Venkatraman, Gilbert, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 10/950,754

(22) Filed: Sep. 27, 2004

(65) Prior Publication Data
US 2005/0035402 A1    Feb. 17, 2005

Related U.S. Application Data

(62) Division of application No. 09/649,368, filed on Aug. 28, 2000, now Pat. No. 6,818,946.

(51) Int. Cl.
H01L 21/331    (2006.01)
H01L 21/8238    (2006.01)
H01L 21/336    (2006.01)

(52) U.S. Cl. ............... 438/212; 438/270; 438/271; 257/332; 257/923

(58) Field of Classification Search .......... 438/212, 438/270, 271; 257/330, 332, 923
See application file for complete search history.

(56) References Cited

U.S. PATENT DOCUMENTS

| | | | | |
|---|---|---|---|---|
| 4,796,070 A | * | 1/1989 | Black | 257/328 |
| 4,941,026 A | * | 7/1990 | Temple | 257/333 |
| 5,082,795 A | * | 1/1992 | Temple | 438/138 |
| 5,122,848 A | * | 6/1992 | Lee et al. | 257/265 |
| 5,326,711 A | * | 7/1994 | Malhi | 438/138 |
| 5,399,515 A | * | 3/1995 | Davis et al. | 438/270 |
| 5,598,018 A | * | 1/1997 | Lidow et al. | 257/342 |
| 5,637,898 A | * | 6/1997 | Baliga | 257/330 |
| 5,895,267 A | * | 4/1999 | Zhao et al. | 438/627 |
| 5,970,344 A | * | 10/1999 | Kubo et al. | 438/270 |
| 5,998,833 A | * | 12/1999 | Baliga | 257/329 |
| 6,005,272 A | * | 12/1999 | Gardner et al. | 257/344 |
| 6,162,743 A | * | 12/2000 | Chu et al. | 438/781 |
| 6,274,437 B1 | * | 8/2001 | Evans | 438/272 |

* cited by examiner

*Primary Examiner*—Long Pham
*Assistant Examiner*—Shrinivas H. Rao
(74) *Attorney, Agent, or Firm*—Kevin B. Jackson

(57) ABSTRACT

A MOSFET device (50) has a trench (60) extending from a major surface (56) of the device (50). Within the trench (60), a gate structure (62) is formed where the top surface (64) is below the major surface (56). Source regions (66, 68) are formed along a vertical wall (84) inside of the trench (60). The source regions (66, 68) have a horizontal component along the major surface (56) and a vertical component extending the vertical wall (84). The majority of the source regions (66, 68) are formed along the vertical wall (84) within the trench (60). A typical aspect ratio of the vertical length of the source regions (66, 68) to the horizontal width is greater than 3:1. An Inter-layer dielectric (ILD) layer (74) is formed on the gate structure (62) within the trench (60) below the major surface (56). A metal electrode layer (82) is formed above the major surface (56) where a portion is formed inside the trench (60) making source contact to the source regions (66, 68) inside the trench (60) along the vertical wall (84) of the trench (60).

20 Claims, 5 Drawing Sheets

TRENCH MOSFET WITH INCREASED CHANNEL DENSITY

The present application is a division of prior U.S. application Ser. No. 09/649,368, filed on Aug. 28, 2000 now U.S. Pat. No. 6,818,946, which is hereby incorporated by reference, and priority thereto for common subject matter is hereby claimed.

BACKGROUND OF THE INVENTION

Trench power MOSFET devices are used in many applications including power supplies, battery chargers, computers, and cell phones. An important aspect to a trench power MOSFET device is its channel density and on-state resistance ($R_{DS(ON)}$). An increase in channel density decreases $R_{DS(ON)}$. A lower $R_{DS(ON)}$ results in a reduction in the total resistance encountered by a drain current flowing from the drain terminal to the source terminal of the power MOSFET device.

Trench power MOSFET devices have a source contact region, and an inter-layer dielectric (ILD) on the top surface of the device which requires a relatively large spacing between the device trenches. A large spacing between trenches limits the cell density of the device. Further reduction in cell size typically requires advanced manufacturing schemes thereby increasing device cost. The limit in the cell density also limits a reduction in $R_{DS(ON)}$.

Thus, a need exists for a trench power MOSFET device that has an increased cell density thereby reducing $R_{DS(ON)}$ of the device.

DETAILED DESCRIPTION OF THE PRIOR ART

Figure 1:
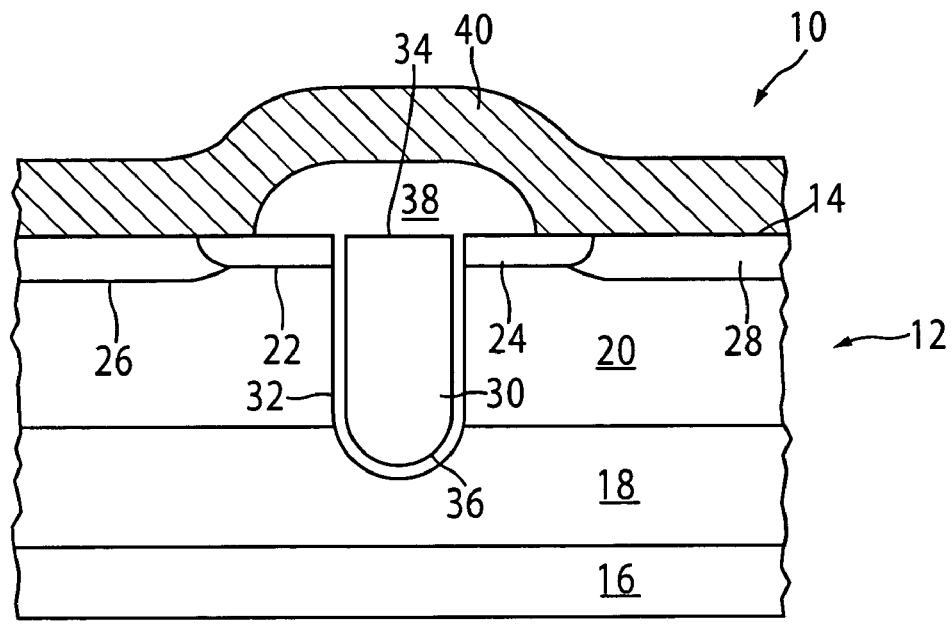
FIG. 1 is a cross-sectional view of a portion of a prior art trench MOSFET device.

The present invention can be better understood by referring to the prior art in FIG. 1 together with the following detailed description of the prior art.

FIG. 1 illustrates a cross-sectional view of a portion of a prior art trench MOSFET device 10. Device 10 includes material body 12 having major surface 14. Material body 12 includes substrate region 16 having semiconductor layer 18 formed on one surface. Base region 20 is formed on semiconductor layer 18 extending down from major surface 14 of material body 12. For an N-channel device, substrate region 16 comprises a heavily doped n-type region and semiconductor layer 18 comprises a more lightly doped n-type region. Base region 20 comprises a lightly doped p-type region. Material body 12 further includes heavily doped n-type source regions 22, 24 having a horizontal component along major surface 14 and a vertical component which extends from the major surface into base region 20. The horizontal component of source regions 22, 24 along major surface 14 is substantially larger than the vertical component of source regions 22, 24. Thus, the majority of source regions 22, 24 are formed along the horizontal component of major surface 14. Material body 12 further includes heavily doped p-type regions 26, 28 which extend from major surface 14 into base region 20. P-type regions 26, 28 are typically deeper than source regions 22, 24.

Trench 32 is formed in material body 12 extending from major surface 14 through base region 20 into semiconductor layer 18. Gate oxide layer 36 is formed along the side walls inside trench 32. Gate structure 30 is formed within trench 32 with top surface 34 of gate structure 30 typically aligned with major surface 14. Inter-layer dielectric (ILD) layer 38 is formed on top surface 34 of gate structure 30, and major surface 14 above a portion of source regions 22, 24. ILD layer 38 typically is an insulating material. A major portion of ILD layer 38 is formed above or substantially coplanar with major surface 14 of material body 12. Source metal layer 40 is formed over the top of ILD layer 38 and major surface 14 of material body 12. Source metal layer 40 makes contact to the top horizontal surface of source regions 22, 24. The entirety of source metal layer 40 is formed above major surface 14.

DETAILED DESCRIPTION OF THE PREFERED EMBODIMENT

In general, the present invention relates to trench MOSFET devices that provide an increase in channel density over which the prior art trench MOSFET devices provide. An increase in channel density is achieved without resorting to more advanced manufacturing equipment than the prior art. An increase in channel density results in a reduction in $R_{DS(ON)}$. In particular, the present invention moves the interlayer dielectric (ILD) region from a horizontal surface along a major surface to a region within the trench, and moves the source regions from a horizontal surface along a major surface to a vertical region along the trench of the MOSFET device. By moving the ILD region and source regions from a horizontal surface to a vertical region within the trench the horizontal dimensions are reduced. Hence, the MOSFET device cells can be packed more densely leading to increased channel density and thus lower $R_{DS(ON)}$. Source contact for the trench MOSFET device is made inside the trench.

Figure 2:
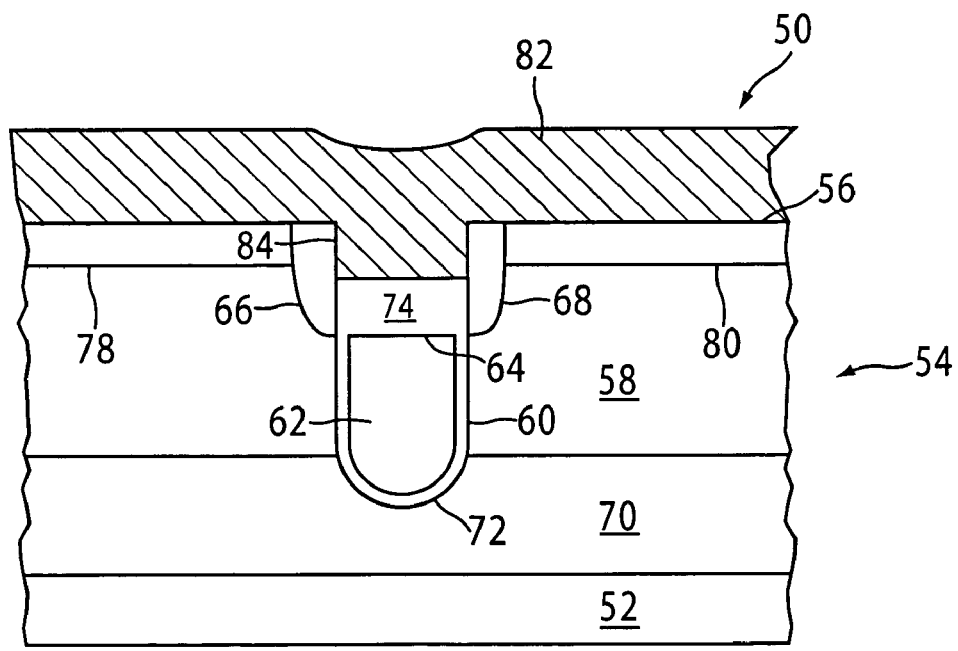
FIG. 2 is a cross-sectional view of a portion of a trench MOSFET device.

FIG. 2 illustrates a cross-sectional view of a portion of trench MOSFET device 50. Device 50 comprises a semiconductor material body 54 having major surface 56. Semiconductor material body 54 includes a first region, denoted substrate region 52, forming a drain region of device 50. A second region, denoted base region 58, extends downward from major surface 56 of semiconductor material body 54. Base region 58 is typically 1.5 um in thickness. For an N-channel device, substrate region 52 comprises a first conductivity region which is heavily doped n-type, and base region 58 comprises a second conductivity region which is lightly doped p-type. Device 50 further comprises trench 60 which extends from major surface 56 through base region 58. Within trench 60, gate structure 62 is disposed with top surface 64 of gate structure 62 aligned below major surface 56.

A third region, denoted source regions 66, 68, comprise a first conductivity region which is heavily doped n-type formed within base region 58 along vertical components of trench 60. Source regions 66, 68 have a horizontal component along major surface 56 and a vertical component which extends from major surface 56 into base region 58. The horizontal component of source regions 66, 68 is defined as in a direction which is perpendicular to trench 60. The vertical component of source regions 66, 68 along the sidewall of trench 60 is substantially larger than the horizontal component perpendicular to trench 60 along major surface 56. Thus, the majority of source regions 66, 68 are formed along the vertical component of the sidewall within trench 60. An aspect ratio of the vertical length of source regions 66, 68 to the horizontal width of source regions 66, 68 is typically greater than 3:1. Source regions 66, 68 are shallow regions of typically 0.2 um in thickness.

A fourth region, denoted epi region 70, comprises a first conductivity region which is lightly doped n-type disposed between base region 58 and substrate region 52. The first conductivity of epi region 70 has a lower dopant concentration than the first conductivity of substrate 52 and source regions 66, 68. Epi region 70 supports the breakdown voltage of device 50. For a low voltage application, i.e. less than 60 volts for an n-type device, epi region 70 is typically 3 to 10 um in thickness, and has a resistivity of approximately 0.1 to 1.5 ohm-cm.

To isolate gate structure 62 from silicon in semiconductor material body 54, an oxide layer, gate oxide layer 72, is disposed between gate structure 62 and the surface of trench 60. Gate oxide layer 72 is typically 100 to 1000 Angstroms in thickness. Inter-layer dielectric (ILD) layer 74 is an insulating material which is formed on top surface 64 of gate structure 62 within trench 60, and below major surface 56. The entirety of ILD layer 74 is formed below major surface 56 within trench 60. The upper surface of ILD layer 74 is substantially below major surface 56 to expose source regions 66, 68 along the sidewalls of trench 60. ILD layer 74 provides an isolation between metal electrode layer 82 and gate structure 62. Metal electrode layer 82 is formed above major surface 56 to provide a low resistive source contact to source regions 66, 68. A portion of metal electrode layer 82 is formed inside trench 60 to make source contact to source regions 66, 68 inside trench 60 along vertical wall 84 of trench 60.

Semiconductor material body 54 further includes doped regions 78, 80 which are heavily doped p-type and extend from major surface 56 into base region 58. Doped regions 78, 80 comprise a second conductivity which has a higher doping concentration than the base region 58. Doped regions 78, 80 typically are formed to a depth of 0.2 to 0.5 um and provide a low contact resistance between metal electrode layer 82 and body region 58.

Figure 3:
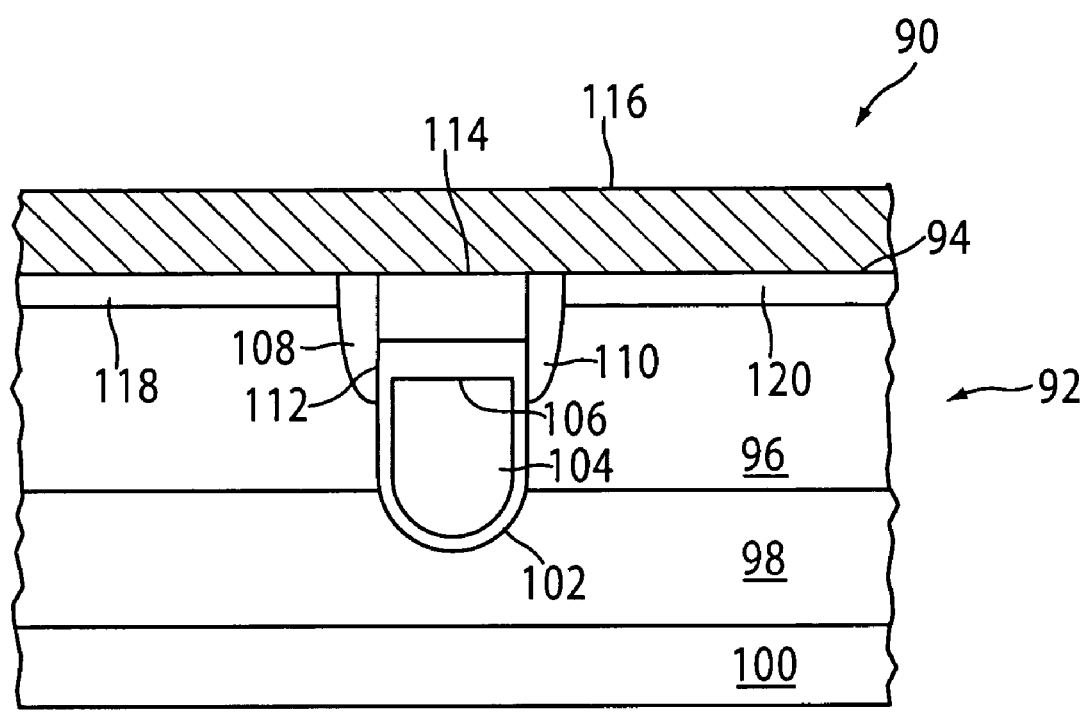
FIG. 3 is an alternative cross-sectional view of a portion of a trench MOSFET device.

FIG. 3 discloses an alternative trench power MOSFET device 90. Device 90 comprises a material body 92 having major surface 94. Material body 92 includes base region 96 epi region 98, and substrate region 100. For an N-channel device, substrate region 100 comprises a first conductivity region which is heavily doped n-type, base region 96 comprises a second conductivity region which is lightly doped p-type, and epi region 98 comprises a first conductivity region which is lightly doped n-type. Device 90 further comprises trench 102 which extends from major surface 94 through base region 96. Within trench 102, gate structure 104 is formed with top surface 106 of gate structure 104 aligned below major surface 94.

Source regions 108, 110 comprise a first conductivity region which is heavily doped n-type formed within trench 102 along vertical components of trench. Source regions 108, 110 have a horizontal component along major surface 94 and a vertical component which extends from major surface 94 into base region 96. The vertical component of source regions 108, 110 along the sidewall of trench 102 is substantially larger than the horizontal component along major surface 94. Thus, the majority of source regions 108, 110 are formed along the vertical component of the sidewall within trench 102.

Inter-layer dielectric (ILD) layer 112 is disposed on top surface 106 of gate structure 104 within trench 102, and below major surface 94. The entirety of ILD layer 112 is disposed below major surface 94 within trench 102. Conductive region 114 is disposed on ILD layer 112 typically aligned with major surface 94 of material body 92. Metal electrode layer 116 is formed above conductive region 114 and major surface 94 to provide a low resistive source contact to source regions 108, 110 and conductive region 114. Conductive region 114 can comprise a highly doped polysilicon layer, a silicide layer, or a refractory metal layer to make an ohmic contact to metal electrode layer 116. Material body 92 further includes p-type regions 118, 120 which are heavily doped and extend from major surface 94 into base region 96. P-type regions 118, 120 provide a low contact resistance between metal electrode layer 116 and body region 92.

In typical operation, metal electrode layer 82 of device 50 (FIG. 2) is connected to ground for an N-channel device and a positive voltage is applied to the drain. To turn on the device, a positive voltage is applied to the gate. The positive gate voltage induces a negative charge along the surface of trench 60 to form a channel in base region 58. The induced channel connects source regions 66, 68 to epi layer 70, and provides a path for current flow between substrate region 52, i.e. drain region, to source regions 66, 68.

Figure 4A:
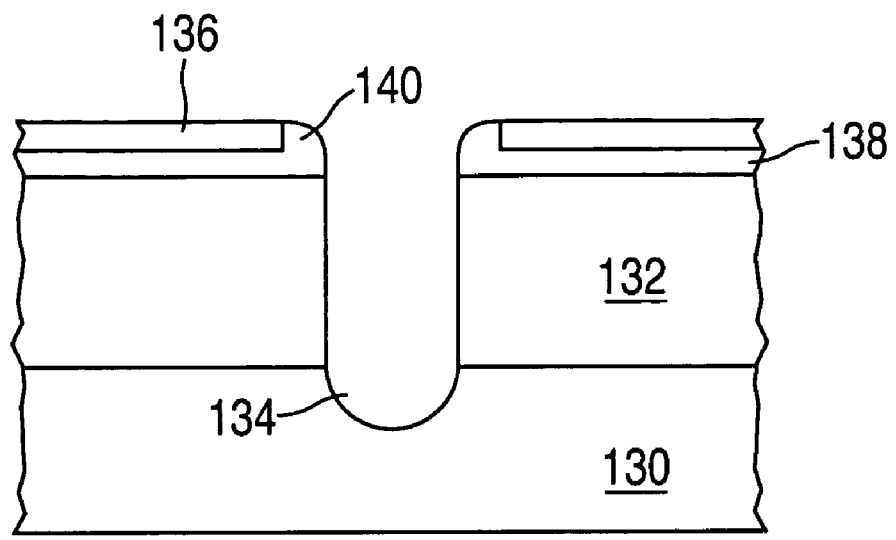
FIG. 4a-4b is a cross-sectional view of a portion of a trench MOSFET device at various stages of source implantation along the trench.
Figure 4B:
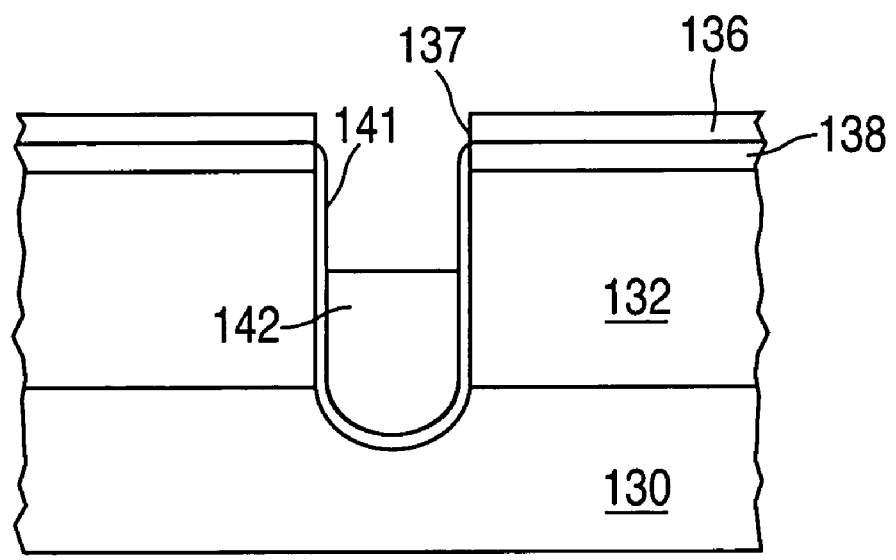

Two methods are used to form source regions 66, 68 along vertical wall 84 of trench 60 illustrated in FIG. 2. Source regions 66, 68 are formed such that source contact to metal electrode layer 82 is made inside trench 60 along vertical wall 84. The first method is the angle implantation method outlined in FIG. 4a-4b and the following steps. PHV region 132 is formed on substrate 130 using ion implantation with a typical dose of $2 \times 10^{13}$ to $2 \times 10^{14}$ atoms/cm$^2$ followed by a high temperature diffusion. Substrate 130 typically has an epi region previously formed on its surface. A stack is formed and patterned on PHV region 132 comprising oxide layer 138 and nitride layer 136. The stack is used as an hardmask for trench 134 etch. Oxide layer 138 is typically 500 to 1000 angstroms in thickness. Nitride layer 136 is typically 1000 to 2000 angstroms in thickness. A second oxide layer with a thickness of 1000 to 2000 angstroms is then deposited over the patterned stack. An anisotropic oxide etch is used to etch the second oxide layer to form oxide spacer 140 at the edges of the stack comprising oxide layer 138 and nitride layer 136 as in FIG. 4a. Trench 134 is etched using the hardmask formed by the stack and oxide spacer 140. A sacrificial oxidation of typically 1000 to 2000 angstroms is used to smooth the sidewalls of trench 134. During the sacrificial oxidation step, silicon along the sidewalls of trench 134 is consumed by the oxide causing the sidewalls to pull back under oxide spacer 140 substantially aligning the sidewalls of trench 134 to edge 137 of nitride layer 136. Essentially, oxide spacer 140 ensures that the sacrificial oxidation step will not pull the side walls of trench 134 under nitride layer 136 causing nitride overhangs and shadowing the subsequent angled source implantation. An etch of the sacrificial oxide and oxide spacer 140 is performed. To form gate structure 62 (FIG. 2), a gate oxide is grown to a typical dimension of 100 to 1000 angstroms to fill trench 134. Then overfill trench 134 with a doped polysilicon and etch back to expose a portion of the sidewall of trench 134. Source regions 66, 68 (FIG. 2) are then formed along sidewalls of trench 134 at trench location 141 by implanting with sufficient tilt angle to form the regions along the sidewalls of trench 134 at a typical dose of $1 \times 10^{15}$ to $1 \times 10^{16}$ atoms/cm$^2$. The dose provides a typical surface concentration of about $1 \times 10^{20}$ atoms/cm$^3$ along the sidewalls of trench 134 to achieve a low contact resistance to a source contact. To form ILD layer 74 (FIG. 2), a sufficient ILD thickness is deposited to overfill trench 134. An etch back of the ILD into trench 134 exposes top portions of source regions 66, 68 (FIG. 2) along the sidewalls of trench 134. An etch of oxide layer 138 and nitride layer 136 then exposes silicon on major surface 56 (FIG. 2). P-type regions 78, 80 (FIG. 2) are formed using ion implantation with a typical dose of $5 \times 10^{14}$ to $5 \times 10^{15}$ atoms/cm$^2$ to achieve a surface concentration of over $1 \times 10^{19}$ atoms/cm$^3$ at major surface 56. A high temperature diffusion forms source junctions at source regions 66, 68 and p-type regions 78, 80 (FIG. 2). To provide a metal contact, a metal is deposited, patterned and etched to form metal electrode layer 82 (FIG. 2) on major surface 56 (FIG. 2). A grind operation of the backside of substrate and a deposit of back metal forms the drain for device 50.

Figure 5A:
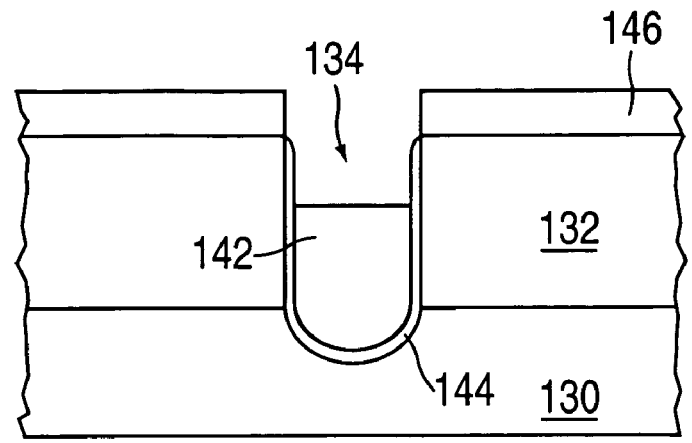
FIG. 5a-5c is a cross-sectional view of a portion of a trench MOSFET device at various stages of outdiffusion to form source regions along the trench.
Figure 5B:
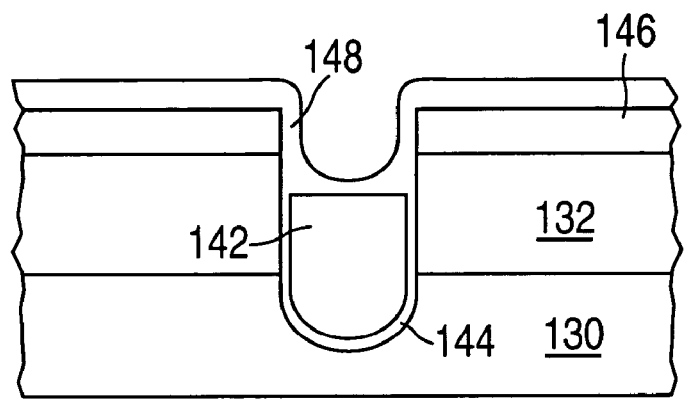
Figure 5C:
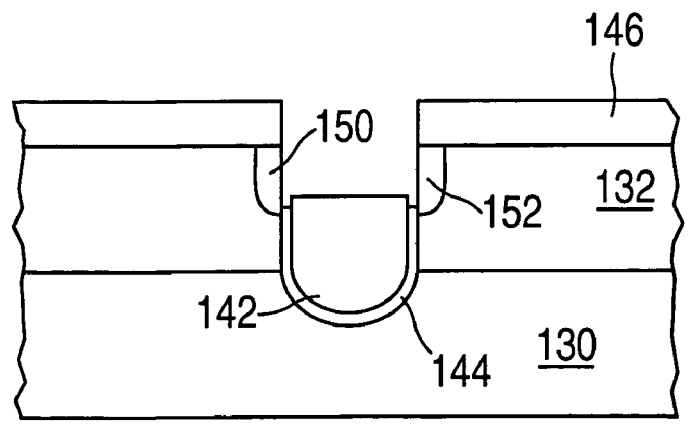

The second method forms source regions 66, 68 (FIG. 2) along trench 134 using outdiffusion as outlined in FIG. 5a-5c. The structure and concentrations are similar to FIG. 4a-4b and include substrate 130, PHV region 132, and trench 134. Insulating material 146 is disposed over PHV region 132 adjacent to trench 134. Gate 142 is recessed into trench 134. Gate 142 is typically a polysilicon material. Gate oxide 144 is etched within trench 134 preferably with an isotropic etch. A predeposition of doped glass layer 148 using for example, phosphine or POCL$_3$ for an N-channel device, or a boron doped glass layer 148 for a P-channel device. Doped glass layer 148 can be used to dope the source junction as well as the polysilicon of gate 142. Source regions 150, 152 are formed along sidewalls of trench 134 during an anneal process and doped glass layer 148 is etched.

Figure 6:
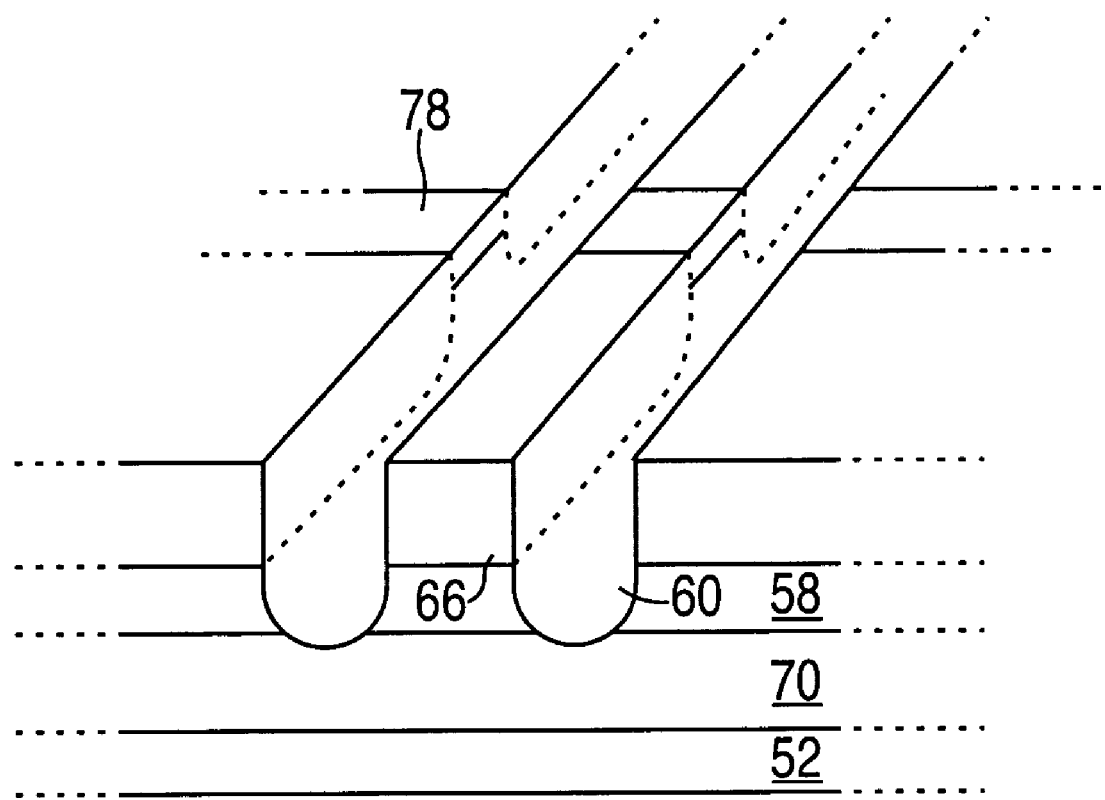
FIG. 6 is a three dimensional view of a stripe based trench MOSFET design.

FIG. 6 illustrates a trench power MOSFET device used in a stripe base orientation. FIG. 2 designations are used to define the regions of the trench power MOSFET device in a stripe base fashion. Essentially, FIG. 2 is a cut away view of a portion of the stripe based trench power MOSFET device of FIG. 6. For example, trench 60 is formed in strips in three dimensional body region 58 with source region 66 along sidewall of trench 60. P-type region 78 is formed along the horizontal surface of the three dimensional body region 58. Electrical contact to p-type region 78 is made at intervals along the stripe. The structure and methods disclosed herein to build the portion as illustrated in FIG. 2 can be used to build the stripe base orientation of FIG. 6.

Thus, a trench power MOSFET device with an increased channel density and a method of making the same has been disclosed. An increase in channel density is possible because the ILD region is moved from a horizontal surface along a major surface to a region within the trench, and the source regions are moved from a horizontal surface along the major surface to a vertical region along the trench of the MOSFET device. Since the horizontal regions were moved inside the trench the MOSFET device cells can be packed more densely leading to increased channel density. An increase in channel density results in a reduction in $R_{DS(ON)}$. What is described herein refers to a MOSFET device, but the same structure and method can be implemented for other MOS gated devices such as IGBT, and MOS controlled thyristors.

What is claimed is:

1. A method for forming a semiconductor device having a major surface, comprising:
   providing a semiconductor material body having a trench with a vertical sidewall, wherein the trench extends from the major surface to a depth within the semiconductor material body;
   forming a gate structure having a top surface within the trench, wherein the top surface of the gate structure is below the major surface;
   forming a source region along the vertical sidewall of the trench, wherein a vertical depth of the source region along the vertical sidewall is greater than a horizontal width of the source region along the major surface of the semiconductor material body; and
   forming a conductive electrode layer adjacent the vertical sidewall of the trench above the gate structure and below the major surface making contact with the source region along a portion of the vertical sidewall.

2. The method of claim 1, wherein the step of forming the source region includes forming the source region using angled ion implantation.

3. The method of claim 1, wherein the step of forming the source region includes forming the source region by diffusing from a predeposited glass layer.

4. The method of claim 1, wherein the step of providing the semiconductor material body includes providing a semiconductor material body having a striped trench with the vertical sidewall, and wherein the step of forming the source region includes forming the source region along a portion of the vertical sidewall, and wherein the method further comprises the step of:
   forming a doped region along a horizontal surface of the semiconductor material and along another portion of the vertical sidewall, wherein the conductive electrode layer makes electrical contact to the doped region along the vertical sidewall, and wherein the doped region has an opposite conductivity type to that of the source region.

5. A method of making a semiconductor device comprising the steps of:
   providing a semiconductor material body having a trench extending from a major surface to a depth within the semiconductor material body;
   forming a source region vertically along a sidewall of the trench above the gate structure and below the major surface of the semiconductor material body;
   forming a gate structure within the trench; and
   forming an interlayer dielectric (ILD) region within the trench above the gate structure and below the major surface of the semiconductor material body.

6. The method of claim 5 wherein the step of providing the semiconductor material body includes providing a substrate region of the first conductivity type disposed in the semiconductor material body and having a base region of the second conductivity type extending from the major surface of the semiconductor material body.

7. The method of claim 6 wherein the step of providing the semiconductor material body includes providing a semiconductor material body having an epi region of the first conductivity type between the substrate region and the base region, wherein the epi region has a lower dopant concentration than the substrate region.

8. The method of claim 6, wherein the step of providing the semiconductor material body includes providing a semiconductor material body having a doped region of the second conductivity type within the base region, wherein the doped region has a higher dopant concentration than the the base region.

9. The method of claim 5, further including the step of forming a conductive electrode layer, wherein a portion of the conductive electrode layer extends within the trench and onto the ILD region making electrical contact to the source region inside the trench.

10. A process for forming a semiconductor device having a major surface comprising the steps of:
   providing a first region of semiconductor material having a first conductivity type and a second region of a second conductivity type disposed above the first region;
   forming a trench extending vertically from the major surface through the second region;
   forming a third region of the first conductivity type in the second region having a vertical component along the trench, wherein the vertical component of the third region along the trench is greater than a horizontal component of the third region; and
   forming a conductive electrode layer formed below the major surface making contact to the third region inside the trench along the vertical component of the third region of the semiconductor device.

11. The method of claim 10, further including the step of forming a fourth region of the first conductivity type between the first region and the second region such that the trench extends partially into the fourth region.

12. The method of claim 10, further including the step of forming a gate structure within the trench, wherein the gate structure has a top surface below the major surface of the semiconductor device.

13. The method of claim 12, wherein the step of forming the gate structure comprises the steps of:
   forming a gate dielectric layer within the trench;
   filling the trench with polycrystalline semiconductor material; and
   removing a portion of the polycrystalline semiconductor material to provide the top surface below the major surface of the semiconductor device.

14. The method of claim 12, further including the step of forming an ILD region in the trench above the top surface of the gate structure.

15. The method of claim 14, wherein the step of forming the ILD region includes forming an ILD region so that a portion of the conductive electrode layer extends within the trench onto the ILD region.

16. The method of claim 10, further including the step of forming a doped region within the second region, and having the second conductivity type, wherein the doped region has a higher dopant concentration than the second region.

17. The method of claim 10, wherein the step of forming the trench comprises the steps of:
   forming a first dielectric layer over the major surface;
   forming a second dielectric layer over the first dielectric layer;
   forming an opening in the first and second dielectric layers;
   forming spacers in the opening;
   etching the trench through the opening;
   forming a sacrificial dielectric layer on sidewalls of the trench; and
   removing the sacrificial dielectric layer and the spacers.

18. The method of claim 17, wherein the step of forming the first dielectric layer includes forming an oxide layer, and wherein the step of forming the second dielectric layer includes forming a nitride layer.

19. The method of claim 17, wherein the step of forming the sacrificial dielectric layer includes forming a sacrificial oxide layer, wherein the formation of the sacrificial oxide layer causes a sidewall to pull back under a spacer to substantially align the sidewall to an edge of the second dielectric layer.

20. The method of claim 10, wherein the step of forming the third region includes forming a third region having a ratio of vertical length to horizontal width greater than 3:1.

* * * * *